United States Patent [19]

Hanak

[11] 4,272,641
[45] Jun. 9, 1981

[54] TANDEM JUNCTION AMORPHOUS SILICON SOLAR CELLS

[75] Inventor: Joseph J. Hanak, Lawrenceville, N.J.

[73] Assignee: RCA Corporation, New York, N.Y.

[21] Appl. No.: 109,637

[22] Filed: Jan. 4, 1980

Related U.S. Application Data

[63] Continuation-in-part of Ser. No. 31,460, Apr. 19, 1979, abandoned.

[51] Int. Cl.³ .......................................... H01L 31/06
[52] U.S. Cl. .................................. 136/249; 136/258; 357/2; 357/30
[58] Field of Search .......... 136/89 SJ, 89 MS, 89 TF, 136/89 P, 249, 255, 258; 357/2, 30

[56] References Cited

U.S. PATENT DOCUMENTS

| 2,949,498 | 8/1960 | Jackson | 136/89 |
|---|---|---|---|
| 3,186,873 | 6/1965 | Dunlap, Jr. | 136/89 |
| 3,483,038 | 12/1969 | Hui et al. | 136/89 |
| 4,017,332 | 4/1977 | James | 136/246 |
| 4,064,521 | 12/1977 | Carlson | 357/2 |
| 4,094,704 | 6/1978 | Milnes | 136/89 TF |
| 4,128,733 | 12/1978 | Fraas et al. | 136/89 SJ |
| 4,133,698 | 1/1979 | Chiang et al. | 136/89 SJ |
| 4,162,505 | 7/1979 | Hanak | 357/30 |
| 4,167,015 | 9/1979 | Hanak | 357/16 |
| 4,190,852 | 2/1980 | Warner, Jr. | 357/30 |

FOREIGN PATENT DOCUMENTS

| 766433 | 1/1957 | United Kingdom | 136/260 |
|---|---|---|---|
| 843686 | 8/1960 | United Kingdom | 136/244 |
| 1290637 | 9/1972 | United Kingdom | 136/249 |

OTHER PUBLICATIONS

A. G. Milnes, "Concepts for Rheotaxically-Grown Thin-Film Tandem III-V Solar Cells", *Conf. Record, 13th IEEE Photovoltaic Specialists Conf.*, (1978), pp. 892-897.
J. J. Loferski, "Tandem Photovoltaic Solar Cells & Increased Solar Energy Conversion Efficiency", *Conf. Record, 12th IEEE Photovoltaic Specialists Conf.*, (1976), pp. 957-961.
M. F. Lamorte et al., "Two-Junction Cascade Solar Cell Characteristics Under $10^3$ Concentration Ratio", *Conf. Record, 13th IEEE Photovoltaic Specialists Conf.*, (1978), pp. 874-880.
M. S. Alvi et al., "The Potential for Increasing the Efficiency of Photovoltaic Systems by Using Multiple Cell Concepts", *Conf. Record, 12th IEEE Photovoltaic Specialists Conf.*, (1976), pp. 948-956.
M. Arienzo et al., "Investigation of Potentially High Efficiency Photovoltaic Cells Consisting of Two Heterojunctions", *Conf. Record, 13th IEEE Photovoltaic Specialists Conf.*, (1978), pp. 898-903.
L. M. Fraas et al., "Design of High Efficiency Monolithic Stacked Multijunction Solar Cells", *Conf. Record, 13th IEEE Photovoltaic Specialists Conf.*, (1978), pp. 886-891.
S. Y. Chiang et al., "Thin Tandem Junction Solar Cell", *Conf. Record, 13th IEEE Photovoltaic Specialists Conf.*, (1978), pp. 1290-1293.
D. E. Carlson, "The Effects of Impurities & Temperature on Amorphous Silicon Solar Cells", *International Electronics & Devices Meeting*, Wash., D.C., (1977), pp. 214-217.
D. E. Carlson, "Amorphous Silicon Solar Cells", *IEEE Trans. Electron Devices*, vol. ED-24, pp. 449-453, (1977).

Primary Examiner—Aaron Weisstuch
Attorney, Agent, or Firm—Birgit E. Morris; Donald S. Cohen; Sanford J. Asman

[57] ABSTRACT

An amorphous silicon solar cell has an active body with two or a series of layers of hydrogenated amorphous silicon arranged in a tandem stacked configuration with one optical path and electrically interconnected by a tunnel junction. The layers of hydrogenated amorphous silicon arranged in tandem configuration can have the same bandgap or differing bandgaps.

18 Claims, 2 Drawing Figures

TANDEM JUNCTION AMORPHOUS SILICON SOLAR CELLS

The invention was made in conjunction with work performed under a Department of Energy Contract #Y-76-C-03-1286.

This application is a continuation-in-part of application Ser. No. 031,460, filed Apr. 19, 1979, now abandoned.

The present invention relates to amorphous silicon solar cells. More particularly, the invention relates to a series of two or more layers of amorphous silicon arranged in a tandem stacked configuration.

BACKGROUND OF THE INVENTION

Photovoltaic devices, i.e., solar cells, are capable of converting solar radiation into useable electrical energy. The energy conversion occurs as a result of what is well known in the solar cell field as the photovoltaic effect. Solar radiation impinging on a solar cell and absorbed by an active region generates electrons and holes. The electrons and holes are separated by a built-in electric field, for example a rectifying junction, in the solar cell. This separation of electrons and holes results in the generation of an electrical current as explained below. For example, a built-in electric field can be generated in a solar cell by an active semiconductor layer with regions of P-type, intrinsic and N-type hydrogenated amorphous silicon. The electrons generated in the intrinsic region, by absorption of solar radiation of the appropriate bandgap, produce electron-hole pairs. The separation of the electron-hole pairs with the electrons flowing toward the region of N-type conductivity, and the holes flowing toward the region of P-type conductivity, creates the photovoltage and photocurrent of the cell.

The photocurrent output of a solar cell is maximized by increasing the total number of photons of differing energy and wavelength which are absorbed by the semiconductor material. The solar spectrum roughly spans the region of wavelengths from about 300 nanometers to about 2200 nanometers, which corresponds to from about 4.2 eV to about 0.59 eV, respectively. The portion of the solar spectrum which is absorbed by the solar cell is determined by the size of the bandgap energy of the semiconductor material. In the past, solar cells were fabricated from single crystal materials such as gallium arsenide, which has a bandgap energy of about 1.45 eV, or crystalline silicon, C-Si, which has a bandgap energy of about 1.1 eV. Solar radiation having an energy less than the bandgap energy is not absorbed by the semiconductor material, and thus does not contribute to the generation of the photocurrent output of the cell.

Semiconductor materials such as GaAs and C-Si have been utilized together in solar cells to increase the overall conversion of solar energy into electrical energy. However, problems are encountered when different semiconductor materials are used in the same solar cell. One solution to the problem of fabricating a solar cell structure with different semiconductor materials was to use filters to reflect light of the appropriate wavelength onto a solar cell of the first material and transmit the non-absorbed light to a cell of the second semiconductor material. A second solution used semiconductor materials of differing bandgaps which could be epitaxially grown on one another, such as aluminum gallium arsenide, gallium arsenide, and gallium phosphide structures. Both these systems have been loosely called tandem junction solar cells. A third alternative was to stack individual solar cells of differing bandgap energies and connect the cells in series. These three alternatives are either cumbersome, expensive and/or bulky.

Thus, it would be highly desirable to have a solar cell structure which could function as a tandem junction solar cell with separate active regions arranged in a stacked configuration without the need for light filters, or epitaxially matching one active region to another, or serially connecting separate solar cells.

SUMMARY OF THE INVENTION

An improved solar cell structure has a plurality of layers of hydrogenated amorphous silicon layers separated by a tunnel junction and arranged in a tandem stacked configuration. The thickness of the layers of amorphous silicon is adjusted to maximize efficiency and equalize the current generated in each layer. Optionally, the tandem stacked hydrogenated amorphous silicon solar cells can have the bandgap of the hydrogenated amorphous silicon layers varied over the range of from about 1.5 eV to about 1.8 eV by adjusting the hydrogen concentration in the hydrogenated amorphous silicon layers.

DETAILED DESCRIPTION OF THE INVENTION

Figure 1:
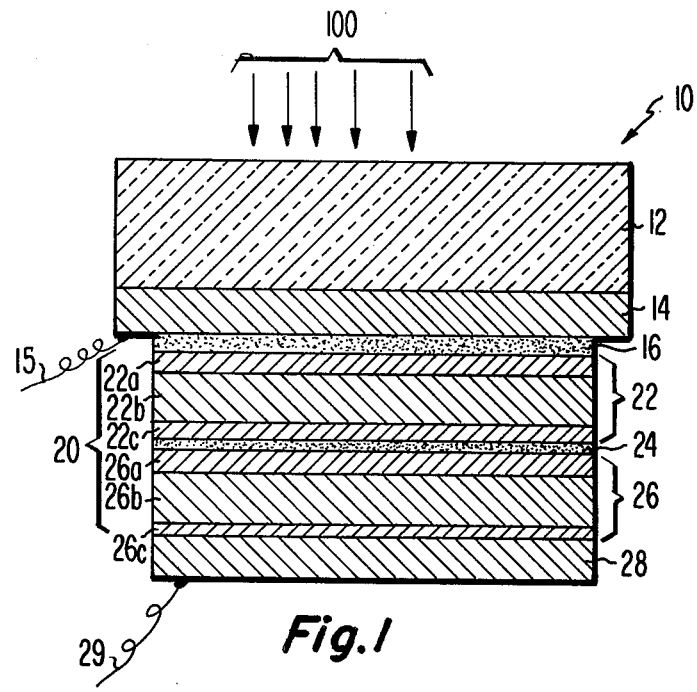
FIG. 1 illustrates a tandem junction hydrogenated amorphous silicon solar cell arranged in a stacked configuration wherein hydrogenated amorphous silicon layers are separated by a tunnel junction.

The invention will be more clearly illustrated by referring to FIG. 1. A tandem junction hydrogenated amorphous silicon solar cell is depicted as solar cell 10. Solar radiation 100 impinging upon the solar cell 10 forms a reference point for the incident surface of each layer or region of the solar cell. The solar cell 10 includes a transparent substrate 12 of glass or other suitable material which is transparent to solar radiation. A transparent conductive oxide, hereinafter termed "TCO", 14 is deposited on substrate 12 and forms an ohmic contact with a cermet layer 16 of $PtSiO_2$ containing from about 10 to about 40 volume percent of platinum and having a thickness of from about 5 to about 25 nanometers. Alternatively, the cermet layer 16 can be a cermet layer as taught in U.S. Pat. No. 4,167,015 and incorporated herein by reference, of a dielectric material such as $TiO_2$.

An active body 20, which comprises a plurality of layers of hydrogenated amorphous silicon wherein each pair of layers of hydrogenated amorphous silicon is separated by a transparent tunnel junction between each adjacent pair of layers, is fabricated upon the cermet layer 16. Each layer forms a photovoltaic generator and is arranged such that the voltages from said amorphous silicon layers are added. In FIG. 1, the active body 20 has two layers 22 and 26 of hydrogenated amorphous silicon separated by a tunnel junction layer 24. The active body 20 can have from 2 to 5 or more layers of hydrogenated amorphous silicon.

A first active layer of hydrogenated amorphous silicon 22, comprised of regions 22a, 22b and 22c of differing conductivity type, is deposited on layer 16. For example, region 22a is an hydrogenated amorphous silicon layer doped with P-type conductivity modifiers such as boron or other suitable P-type dopants. Said region is from about 5 to about 50 nanometers thick and preferably less than about 37.5 nanometers thick and most preferably about 8 nanometers thick. Region 22b is intrinsic hydrogenated amorphous silicon having a thickness of from about 40 to about 500 nanometers. Intrinsic hydrogenated amorphous silicon has been found to be of slightly N-type conductivity as reported in U.S. Pat. No. 4,064,521 to Carlson, incorporated herein by reference. A region 22c on N+-type hydrogenated amorphous silicon, having a thickness of from about 10 to about 50 nanometers, is contiguous to the intrinsic hydrogenated amorphous silicon region 22b. Of course, the conductivity of the regions could be reversed.

The tunnel junction layer 24 is situated between active layers 22 and 26 and provides a single electrical path through the first active layer 22 and the second active layer 26 to the back substrate 28. Layer 24 is from about 2 to about 15 nanometers thick and is comprised of cermets such as $PtSiO_2$, $PtY_2O_3$, $IrSiO_2$, $IrY_2O_3$, or other cermets incorporating metals having work functions in excess of about 4.8 eV such a palladium, rhenium, rhodium, and the like, or a thin metal layer, about 2 to about 5 nanometers thick, and a cermet. High work function cermets described in U.S. Pat. No. 4,167,015 are also suitable.

The metal layer can be a metal such as platinum, titanium, chromium nickel and like metals which are transparent to solar radiation. Preferably, the metal layer is arranged in the structure such that the metal layer is between the N or N+-type region of one amorphous silicon layer and the cermet layer, and said cermet contacts the P or P+-type region of an adjacent amorphous silicon layer. The metal layer-cermet layer combination removes the hump in the current-voltage (IV) curve of the solar cell which indicates the presence of a reverse diode or a bad contact in the structure between the amorphous silicon layers. The performance of a tandem junction solar cell 10 is degraded if tunnel layer 24 is an insulator in spite of the fact that said insulator could be thin enough to permit electrons to tunnel therethrough.

Theoretically, tunnel layer 24 could be omitted if region 22c of N+-type hydrogenated amorphous silicon and region 26a of P+-type hydrogenated amorphous silicon could incorporate N-type and P-type conductivity modifiers in sufficient quantities to generate a tunnel junction between active layers 22 and 26. Although solar cell 10 can be fabricated without layer 24, sufficiently high doping levels to create a tunnel junction state with comparable performance to a $PtSiO_2$ cermet and like materials or a thin metal layer, have not been achieved in hydrogenated amorphous silicon.

The second active layer 26 comprises regions 26a, 26b, and 26c of hydrogenated amorphous silicon of differing conductivity type. Region 26a is similar to region 22a and incorporates suitable P+-type dopants. Region 26b is similar to region 22b and region 26c is similar to region 22c. Optionally, regions 26a, 26b, and 26c may be deposited at a higher temperature to produce a layer with a lower concentration of hydrogen and a lower bandgap energy than active layer 22. The thickness of the second active layer 26 should be adjusted so that the current produced by said layer is about equal to the current produced by the first active layer 22 since the total current of the cell will be limited to the lower current of either active layer 22 or 26.

The conversion efficiency of the hydrogenated amorphous silicon solar cell of light into electricity approaches a constant when the intrinsic region thickness is about 500 nanometers. In a tandem junction solar cell, any additional thickness of this region only serves to increase the absorption of solar radiation without an increase in cell performance and robs any subsequent layers of the solar radiation. Therefore, the thickness of each intrinsic region should be thinner as the number of stacked hydrogenated amorphous silicon layers increases.

A metal film 28, such as titanium, molybdenum or niobium and like materials, which is adherent to and forms a good ohmic contact with the N+-type hydrogenated amorphous silicon region 26c, is deposited on region 26c. Wires 15 and 29 are attached to metal layers 14 and 28 respectively to withdraw the current generated during illumination of the solar cell 10.

Figure 2:
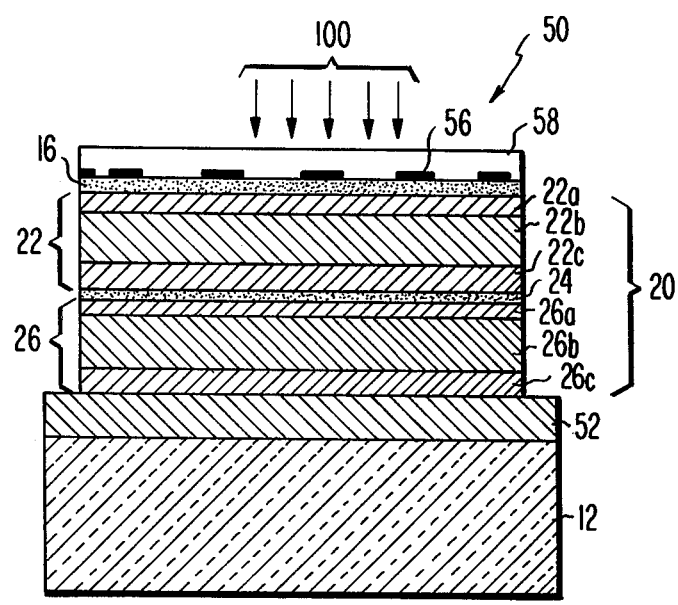
FIG. 2 illustrates a tandem junction hydrogenated amorphous silicon solar cell incorporating a grid electrode and a thick film cermet.

Another embodiment of the present invention is illustrated in FIG. 2. FIG. 2 illustrates a solar cell 50 with the substrate 12 in an inverted order to solar cell 10 of FIG. 1. Corresponding layers and regions of solar cells 50 and 10 have the same numbers in FIG. 2. Since solar radiation 100 does not have to pass through the substrate 12, the substrate can be a metal layer such as stainless steel, molybdenum, titanium, and like materials. In addition, layer 14 such as in solar cell 10 is not needed to make the substrate electrically conductive.

Building the solar cell 50 in an inverted order permits the incorporation of a thick film ballast resistor cermet film layer 52, which may be comprised of a nickel cermet, a grid electrode 56, and a TCO anti-reflection coating 58 into the cell structure. Layer 52 helps to minimize the effect of electrical shorts as taught in U.S. Pat. No. 4,162,505, and incorporated herein by reference.

The solar cells of FIG. 1 and FIG. 2 may be fabricated by several methods. Layer 14 is deposited on the substrate 12 by evaporation or other methods known in the art such as electrochemical deposition. The cermet layer is fabricated in accordance with the teachings in the previously mentioned U.S. Pat. No. 4,162,505, incorporated herein by reference. The layers 22 and 26 of hydrogenated amorphous silicon are deposited by a glow discharge of silane or other appropriate silicon and hydrogen-containing atmosphere, as taught in the previously mentioned Carlson patent and U.S. Pat. No. 4,196,438; also incorporated herein by reference. Layers 22 and 26 can also be fabricated with an RF deposition system. Suitable parameters for RF discharge are an RF power equal to or less than about 0.5 watt per square centimeter (w/cm$^2$), on a target having an area of about 160 cm$^2$, a gas pressure of from about 20 millitorr to about 50 millitorr, a silane flow rate of about 30 sccm and a system temperature of from about 150° to about 350° C. The P-type region of layers 22 or 26 is fabricated with a P-type dopant concentration of a suitable P-type dopant such as boron in the form of $B_2H_6$ from about 0.1 to about 2 percent of the deposition atmosphere. The N+-type region is fabricated with a concentration of the N-type dopant such as $PH_3$ of about 0.2 to 3 percent of the deposition atmosphere. Finally, the metal layers are deposited by evaporation or RF sputtering or other suitable methods.

A solar cell fabricated in accordance with the previous description exhibits overall cell voltages which are slightly less than the sum of the voltages from the individual active layers. The difference in voltage is probably due to the filtering and absorption of sunlight passing through each successive hydrogenated amorphous silicon layer.

The invention will be further illustrated by the following Examples, but it is to be understood that the invention is not meant to be limited solely to the details described therein. Modifications which would be obvious to one of ordinary skill in the solar cell art are contemplated to be within the scope of the invention.

EXAMPLE I

A low sodium content glass about 1/16" thick was coated with about 58 nanometers of transparent conductive oxide (TCO), indium tin oxide, by RF sputtering at a pressure of about $1\times10^{-2}$ Torr and subsequently annealed at about 400° C. for about 24 hours. The TCO coating has a sheet resistivity of less than about 10 ohms/square ($\Omega/\square$). A platinum cermet ($PtSiO_2$) was deposited on the TCO by RF co-sputtering to a thickness of about 11 nanometers. The cermet had a platinum content of from about 10 to about 15 volume percent, an optical transmittance in the visible region of the aperture of about 95 percent and a resistivity of less than about $10^6$ ohm-cm at room temperature. The first layer of hydrogenated amorphous silicon having regions of P+-type, intrinsic, and N+-type conductivity was deposited on the platinum cermet in accordance with U.S. Pat. Nos. 4,167,015 and 4,162,505. The P+-type region contacts the cermet and the other regions are contiguous to said region as previously recited. The P+-type and N+-type regions were about 41 and 45 nanometers thick, respectively. The intrinsic region was about 270 nanometers thick. The sequence was repeated with a $PtSiO_2$ cermet layer as the tunnel layer and a second layer of hydrogenated amorphous silicon having three regions. The second cermet layer had a thickness of about 9 nanometers. The P+-type, intrinsic, and N+-type regions were about 32, 500, and 45 nanometers thick, respectively. Finally, a metal film electrode of aluminum was evaporated to a thickness of about 200 nanometers onto the N+-type region of the second layer.

The stacked cell in a tandem configuration was illuminated with a light having an intensity of one sun. The measured open circuit voltage ($V_{oc}$) was about 1.21 volts and the short circuit current ($J_{sc}$) was about 1.71 milliamperes per square centimeter ($mA/cm^2$).

EXAMPLE II

A tandem junction solar cell was fabricated in accordance with the procedure outlined in Example I; however, a titanium metal layer with a thickness of about 5 nanometers was deposited on the N+-type region of the first layer of hydrogenated amorphous silicon and before the deposition of the $PtSiO_2$ cermet and the second layer of hydrogenated amorphous silicon. The $PtSiO_2$, P+ region and N+ region for both amorphous silicon layers were the same and about 18, 36, and 36 nanometers thick, respectively. The first intrinsic region has a thickness of about 91 nanometers and the second intrinsic region has a thickness of about 500 nanometers. The TCO layer was about 250 nanometers thick and the titanium contact to the second amorphous silicon layer was about 260 nanometers thick. Upon illumination with a light having an intensity equivalent to one sun, the cell had a $V_{oc}$ of about 1.34 volts and a $J_{sc}$ of about 2.5 $mA/cm^2$.

EXAMPLE III

A tandem junction solar cell was fabricated in accordance with the procedures outlined in Example I; however, there was no cermet layer or metal layer separating the first and second layers of hydrogenated amorphous silicon. The front cermet was about 15 nanometers thick. The P+-type and N+-type regions of both layers were about 45 nanometers thick. The first intrinsic region was about 76 nanometers thick and the second intrinsic region was about 590 nanometers thick. Upon illumination, the cell had a $V_{oc}$ of about 960 mV and a short circuit current of about 1.98 $mA/cm^2$. The low $V_{oc}$ indicates the presence of a reverse diode formed between the N+-type region of the first layer and the P+-type region of the second layer of hydrogenated amorphous silicon.

Example IV

A tandem junction solar cell having five layers of hydrogenated amorphous silicon was fabricated in accordance with the procedure outlined in Example I. The thickness of the intrinsic regions increased in each subsequent layer to equalize the currents of each cell. The thicknesses of the intrinsic regions were 45, 45, 53, 68, 363 nanometers, respectively. Upon illumination, the solar cell exhibited a $V_{oc}$ of about 2.4 volts and a $J_{sc}$ of about 0.580 $mA/cm^2$.

COMPARATIVE EXAMPLE I

A tandem junction solar cell was fabricated in accordance with the procedure outlined in Example I; however, two insulating layers of $Si_4N_3$ about 2 nanometers thick separated three layers of hydrogenated amorphous silicon. The layers of amorphous silicon had N+ and P+ type regions of comparable thickness, and intrinsic amorphous silicon regions of 38 nanometers, 145 nanometers, and 38 nanometers thickness, respectively. The insulating layer was deposited by a glow discharge. upon illumination, the cell exhibited a $V_{oc}$ of about 200 mV. Although the insulating layer was thin enough to permit the tunneling of electrons therethrough, the solar cell performance does not compare to the open circuit voltage of the previous Examples.

I claim:
1. An amorphous silicon solar cell comprising:
an active body having a first major surface and a second major surface opposite to said first major surface, wherein said active body comprises a plurality of layers of hydrogenated amorphous silicon each having regions of differing conductivity type, each of said layers forming a photovoltaic generator, said layers being arranged in stacked configuration such that the photovoltages from each of said layers is added, and a transparent, high work function metal cermet layer forming a tunnel junction between each adjacent pair of layers of hydrogenated amorphous silicon;
a transparent high work function metal cermet contacting said first major surface; and
means for electrically contacting said last mentioned transparent high work function metal cermet.

2. The amorphous silicon solar cell according to claim 1 wherein said transparent, high work function metal cermet forming said tunnel junction comprises a cermet selected from the group consisting of $PtSiO_2$, $IrSiO_2$, $PtY_2O_3$, $IrY_2O_3$, and cermets incorporating metals having work functions in excess of 4.8 eV.

3. The amorphous silicon solar cell in accordance with claim 2 wherein the cermet is selected from the group consisting of $PtSiO_2$, $PtY_2O_3$, $IrSiO$, and $IrY_2O_3$.

4. The amorphous silicon solar cell according to claim 1 wherein said plurality of layers comprises from 2 to 5 layers of hydrogenated amorphous silicon.

5. The amorphous silicon solar cell according to claim 1 further incorporating a transparent metal layer adjacent said transparent, high work function metal cermet layer forming said tunnel junction.

6. The amorphous silicon solar cell according to claim 5 wherein said transparent metal layer is disposed between the incident surface of each of said transparent, high work function cermet tunnel junction forming layers and the surface opposed to the incident surface of each of said layers of hydrogenated amorphous silicon.

7. The amorphous silicon solar cell according to claim 5 wherein said plurality of layers comprises from 2 to 5 layers of hydrogenated amorphous silicon.

8. The amorphous silicon solar cell according to claim 7 wherein the energy bandgap of the hydrogenated amorphous silicon layers is adjusted to taper from the lowest bandgap energy layer which forms the first major surface of the active body to the highest bandgap energy layer which forms the second major surface.

9. The amorphous silicon solar cell according to claim 8 wherein the energy bandgap of the hydrogenated amorphous silicon is adjusted by varying the content of hydrogen incorporated into the hydrogenated amorphous silicon layer.

10. The amorphous silicon solar cell according to claim 1 wherein each of said plurality of layers of amorphous silicon has three regions of differing conductivity type wherein a first region is of $P^+$-type conductivity, a said second region contiguous to said first region is of intrinsic hydrogenated amorphous silicon, and a third region of $N^+$-type conductivity is contiguous to said second region.

11. The amorphous silicon solar cell according to claim 10 wherein the first region of the first layer forms said first major surface and contacts said transparent high work function metal cermet layer contiguous to said first region, the third region of said layer contacts said transparent, high work function metal cermet tunnel junction forming layer and the first region of the second layer contacts said last mentioned transparent, high work function metal cermet tunnel junction forming layer opposite to said third region of said first layer.

12. The amorphous silicon solar cell according to claim 10 further incorporating a transparent metal layer disposed between and contacting said tunnel junction layer and the $N^+$-type conductivity region of the adjacent layer of hydrogenated amorphous silicon.

13. The hydrogenated amorphous silicon solar cell according to claim 12 further incorporating a grid electrode on said transparent high work function metal cermet layer which contacts said first region of said first layer.

14. The hydrogenated amorphous silicon solar cell according to claim 13 further incorporating an antireflection layer deposited upon said grid electrode.

15. The amorphous silicon solar cell according to claim 14 wherein said plurality of layers comprises from 2 to 5 layers of hydrogenated amorphous silicon.

16. The amorphous silicon solar cell according to claim 17 further incorporating a thick film nickel cermet disposed between said second major surface of said active body and said electrically conductive substrate.

17. The amorphous silicon solar cell according to claim 15, further comprising an electrically conductive substrate in ohmic contact with said second major surface of said active body.

18. The amorphous silicon solar cell of claim 12, further comprising a transparent electrically conductive substrate in ohmic contact with said first major surface of said active body.

* * * * *